United States Patent [19]

Lindgren

[11] Patent Number: 4,740,654

[45] Date of Patent: Apr. 26, 1988

[54] MODULAR DOUBLE ELECTRICALLY ISOLATED SHIELDING ENCLOSURE

[76] Inventor: Erik A. Lindgren, 4559 Cordoba Way, Oceanside, Calif. 92056

[21] Appl. No.: 893,699

[22] Filed: Aug. 6, 1986

[51] Int. Cl.$^4$ ............................................. H05K 9/00
[52] U.S. Cl. ............................ 174/35 MS; 403/364
[58] Field of Search .................. 174/35 MS; 403/364

[56] References Cited

U.S. PATENT DOCUMENTS

| | | | |
|---|---|---|---|
| 2,765,362 | 10/1956 | Lindgren | 174/35 |
| 2,853,541 | 9/1958 | Lindgren | 174/35 |
| 2,858,582 | 11/1958 | Toulmin, Jr. | 403/364 X |
| 2,860,176 | 11/1958 | Lindgren | 174/35 |
| 2,925,457 | 2/1960 | Lindgren | 174/35 |
| 3,009,984 | 11/1961 | Lindgren | 174/35 |
| 3,070,646 | 12/1962 | Lindgren | 174/35 MS |
| 3,153,692 | 10/1964 | Lindgren | 174/35 |
| 3,217,085 | 11/1965 | Lindgren | 174/35 |
| 3,246,072 | 4/1966 | Lindgren | 174/35 MS |
| 3,322,879 | 5/1967 | Lindgren | 174/35 MS |
| 3,498,011 | 3/1970 | Lindgren | 52/31 |
| 3,783,174 | 1/1974 | Lindgren | 174/35 MS |
| 3,790,696 | 2/1974 | Lindgren | 174/35 MS |
| 4,507,520 | 3/1985 | Lindgren | 174/35 MS |

Primary Examiner—R. L. Moses
Assistant Examiner—David A. Tone
Attorney, Agent, or Firm—Baker, Maxham & Jester

[57] ABSTRACT

A double isolated electrically shielded screen room in which all side, ceiling and floor panels thereof are provided with peripheral grooves. A tongue strip matingly engages the grooves in adjacent panels and clamping is completed with bolts. This construction minimizes the number of individual elements required for the screen room and facilitates assembly and disassembly. To reduce the possibility of the wood frame members being split, they may be partially cut through at the base of each groove. Alternatively, the frame members could be fully cut through, resulting in two individual pieces, permitting more freedom in putting the shielding on each panel.

2 Claims, 4 Drawing Sheets

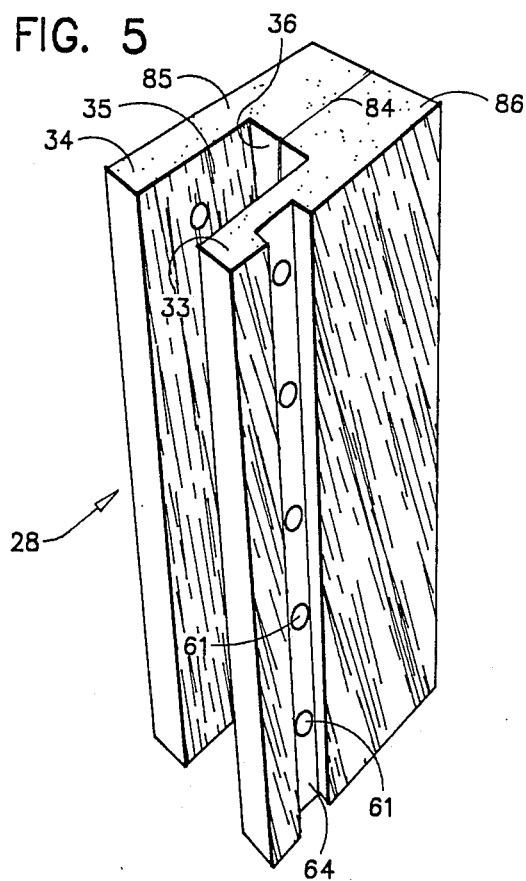

MODULAR DOUBLE ELECTRICALLY ISOLATED SHIELDING ENCLOSURE

FIELD OF THE INVENTION

This invention relates generally to electrically shielded enclosures, typically referred to as screen rooms, for protection of the interior from electrical, electrostatic and magnetic fields, and more particularly concerns an improved construction for such screen rooms which require a minimum number of elements and permits the room to be readily assembled and disassembled with no loss of shielding effectiveness.

DISCUSSION OF THE PRIOR ART

Shielding efficiency is related to conductivity and non-permeability. It is well known that continuous electrical conductivity between contiguous points in a shielding element affords marked efficiency as a radio frequency shield in the intermediate and lower wave bands. By utilizing multiple mutually spaced shielding panels, the extend of shielding may be further enhanced and extended over a wider range of frequencies.

Various materials are known to possess shielding characteristics which, to some degree, serve the purpose of isolating a space between or against electrical, magnetic and electrostatic wave penetrations. In prior shielded enclosures of this type, a copper mesh screen has typically been used and is normally considered to be an effective shielding material. Galvanized steel or stainless steel mesh may also be used, in addition to sheet metal such as copper, galvanized or stainless steel. Additionally, it has been found that a laminated structure which utilizes a thin layer of suitable metal mounted to a flexible fibrous material also provides many desirable characteristics as shielding material.

In construction of a double shielded isolation room, each individual shield must completely encompass the space to be shielded, one within the other, it must maintain continuity of conduction between adjacent sections of the same shield and at the same time maintain electric isolation of the spaced apart shields.

In joining adjacent panels to form a double isolated screen room, it is necessary to provide a means of positively securing the panels in tight and rigid relationship, with positive electrical connection where desired. Further, it is advantageous to permit the connection of adjacent panels with a minimum amount of hardware and shielding joining members while at the same time enhancing the effectiveness of the shielded enclosure, and to provide a solid, rigid structure to eliminate the possibility of separation of the panels with commensurate electrical field leakage.

A number of U.S. patents have been issued to the present inventor which pertain to screen rooms. Among them are U.S. Pat. Nos. 3,783,174, 3,790,696 and 4,507,520. These patents are useful in providing background information with respect to double isolated screen rooms.

SUMMARY OF THE INVENTION

Broadly speaking, this invention concerns a screen room design of improved modularity and simplicity with a minimum of connections necessary, thereby resulting in fewer seams, less potential leaks and reduced labor costs for assembly.

A plurality of generally rectangular panels are employed to construct the screen room of this invention. Each of the panels is formed with a circumferential groove therearound. Some of the panels have the groove arranged at a right angle to the general plane of the panel. This is necessary for making vertical corners in the side walls and to connect the side walls to the floor and ceiling panels. In any event, all panel interconnections are made with two facing grooves interconnected by means of a torque strip and a plurality of bolts accessible from inside the enclosure.

Each of the panels has shielding material covering the flat sides thereof which extends over the flanges and partly into each side of the peripheral grooves. The tongue strip is formed with a relatively narrow shielding material on either side thereof which makes contact between the shielding material on two adjacent panels on each side of the groove, but at the same time maintains isolation between the inside and outside shielding material.

The frame members in which the grooves are formed are typically made of wood. In order to reduce the possibility of splitting of the wood during assembly, a slot may be formed at the base of each groove part way through the remaining thickness of the frame member. This permits increased flexibility for fitting the tongue strip into the grooves and clamping them together without any loss of electrical isolation. Alternatively, the opposite side of each frame member forming the groove may be a separate element, thereby allowing use of thinner pieces of wood. In effect, the groove is cut all the way through for this alternative embodiment, thereby having the advantages of the slot and the additional advantage of permitting use of thinner pieces of wood.

BRIEF DESCRIPTION OF THE DRAWING

The objects, advantages and features of this invention will be more clearly understood from the following detailed description, when read in conjunction with the accompanying drawing, in which:

FIG. 5 is a perspective outside view of a frame member showing the T-nut groove.

DESCRIPTION OF THE PREFERRED EMBODIMENT

Figure 1:
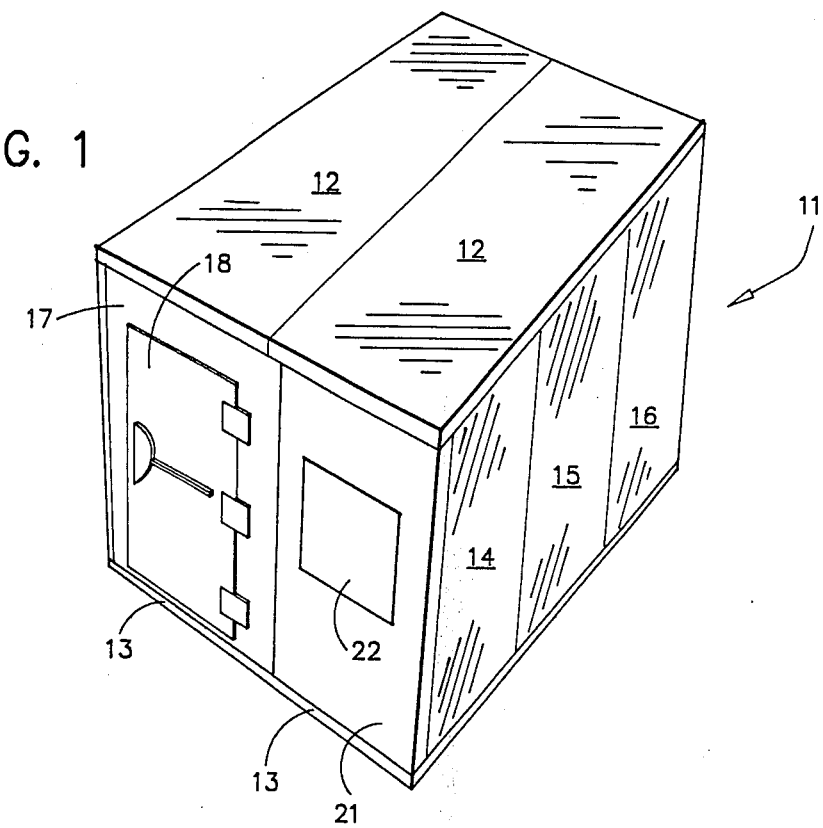
FIG. 1 is a perspective view of a screen room constructed in accordance with this invention.
Figure 2:
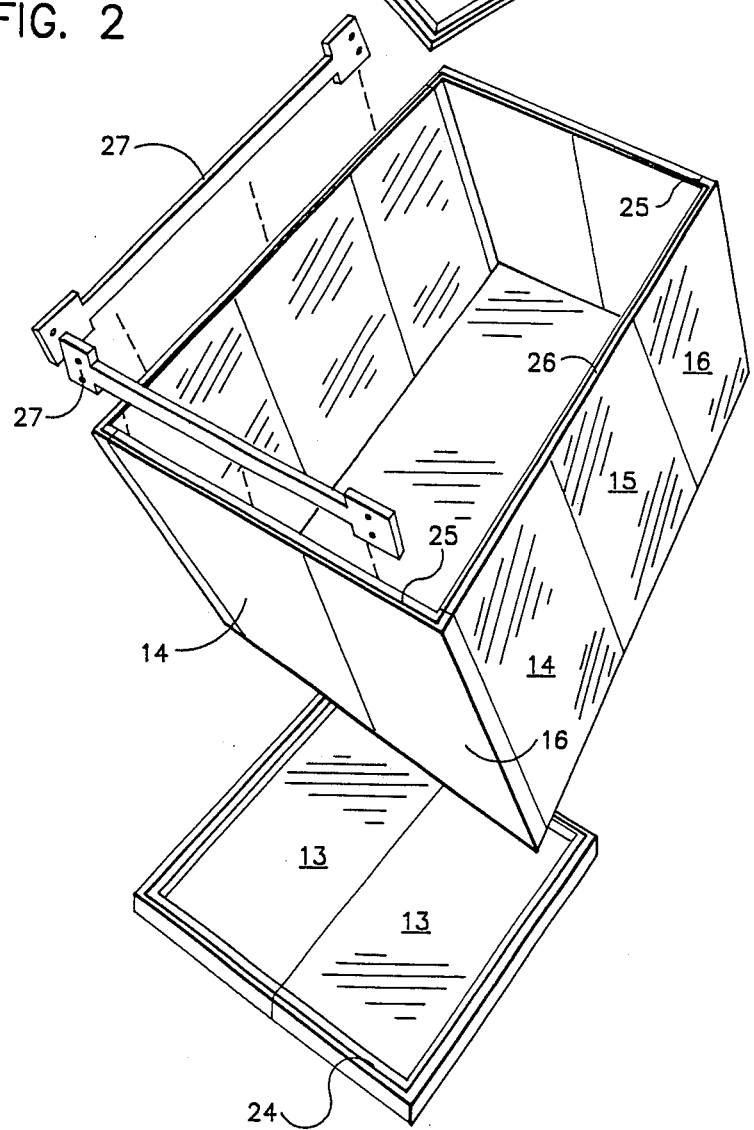
FIG. 2 is a partially exploded perspective view of the screen room of FIG. 1 showing the facing peripheral grooves.

With reference now to the drawing, and more particularly to FIGS. 1 and 2 thereof, there is shown a double isolated shielding enclosure 11 of modular construction in accordance with this invention. Two identical top panels 12, which are substantially the same as floor panels 13, are connected together in spaced fashion and to side panels 14, 15 and 16. Side panel 17 may be fitted with door 18 while side panel 21 may be fitted with a filter panel 22, both in known manner. It is desirable for structural strength that the joint between side panels, such as panels 17 and 21, not be coincident with the joint between top panels 12 or floor panels 13. The filter panel shown is intended to represent line filters, electrical isolation ventilators and power line conduits which may be provided in any of the panels. The manner in which the door and filter panel may be constructed to interconnect with the side, top or floor panels to maintain electrical shielding integrity is described in other available literature. Note from FIG. 2 that top and bottom panels 12 and 13 have grooves 23 and 24 oriented at right angles to the plane of the panel, while side panels 16 are formed with groove 25 having a right angle bend at one end thereof. Side panels 14 and 15 are each formed with grooves 26 which are fully linear. As can be seen in FIG. 2, tongue strips 27 are the means for fitting together the facing grooves of the various panel members.

Figure 3:
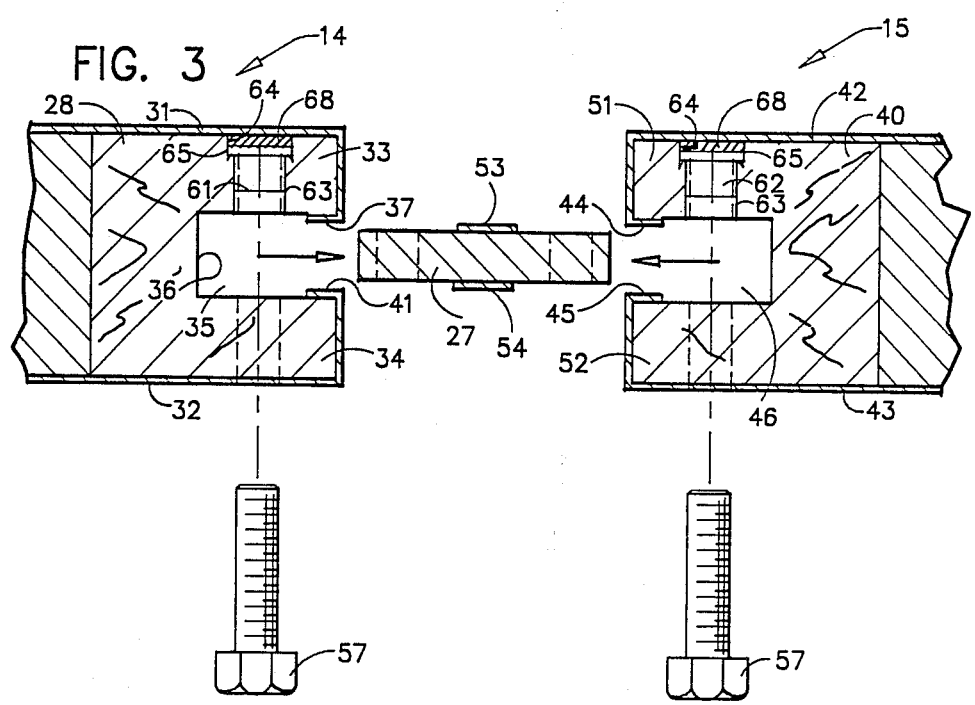
FIG. 3 is a fragmentary cross sectional view of mating edges of two adjacent panels in position to be joined.

The detail of the manner in which tongue strip 27 interconnects adjacent panel members 14 and 15 is shown in FIG. 3. Panel member 14 is formed with outer electrical shielding material 31 and inner electrical shielding material 32. These sheets bend over the ends of flanges 33 and 34, which form groove 35, and extend part way down toward blind end 36 of the groove. These short portions on the inside of the flanges may be referred to as facing shield surfaces 37 and 41. Similarly, on side panel 15 there is outer shield 42 and inner shield 43 forming facing shield surfaces 44 and 45 extending part way down into groove 46 after extending over flanges 51 and 52 forming the groove.

Figure 6:
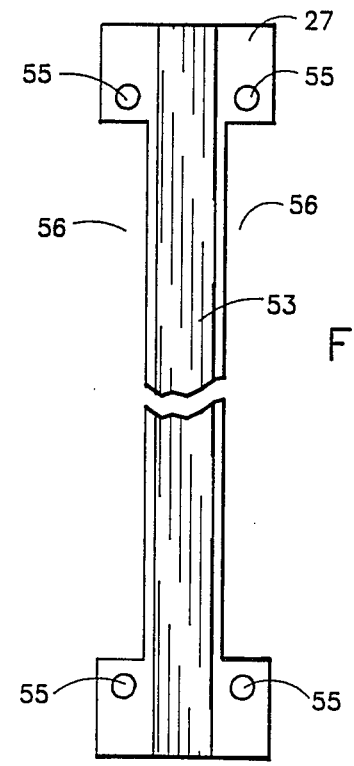
FIG. 6 is a side view of a tongue strip showing holes and elongated cutouts therethrough.

Tongue strip 27 is formed of the same electrically insulative material as are frame members 28 and 40. This is typically dressed lumber such as pine. On each side of elongated tongue strip 27 is an elongated strip of shielding material 53 and 54. With reference to FIG. 6, it can be seen that tongue strip 27 is formed with two holes 55 at each end and elongated cutout side recesses 56. Bolts 57 extend through flanges 34 and 52, through holes or openings 55 and 56 respectively in the tongue strip and into holes 61 and 62 in flanges 33 and 51 respectively. It is the bolts through holes 55 which hold adjacent panels together, as will be discussed later herein. Where the tongue strip is long, for example, eight feet or more, it may be desirable to have another flange approximately in the middle of its length through which a pair of bolts 57 pass. In each hole 61, 62 are fitted threaded T-nuts 63 having the heads 65 thereof recessed in grooves 64 in frame members 28 and 40. These grooves and the hole through the flanges of the frame members can be more easily seen with reference to FIG. 5. It is also clear that the frame members are U-shaped in cross section. After the T-nuts are installed, groove 64 is filled with a dielectric material such as wood mastic 68. This holds the nuts in position while maintaining shielding integrity and preventing contact between the nut and outside shielding 31.

Figure 4:
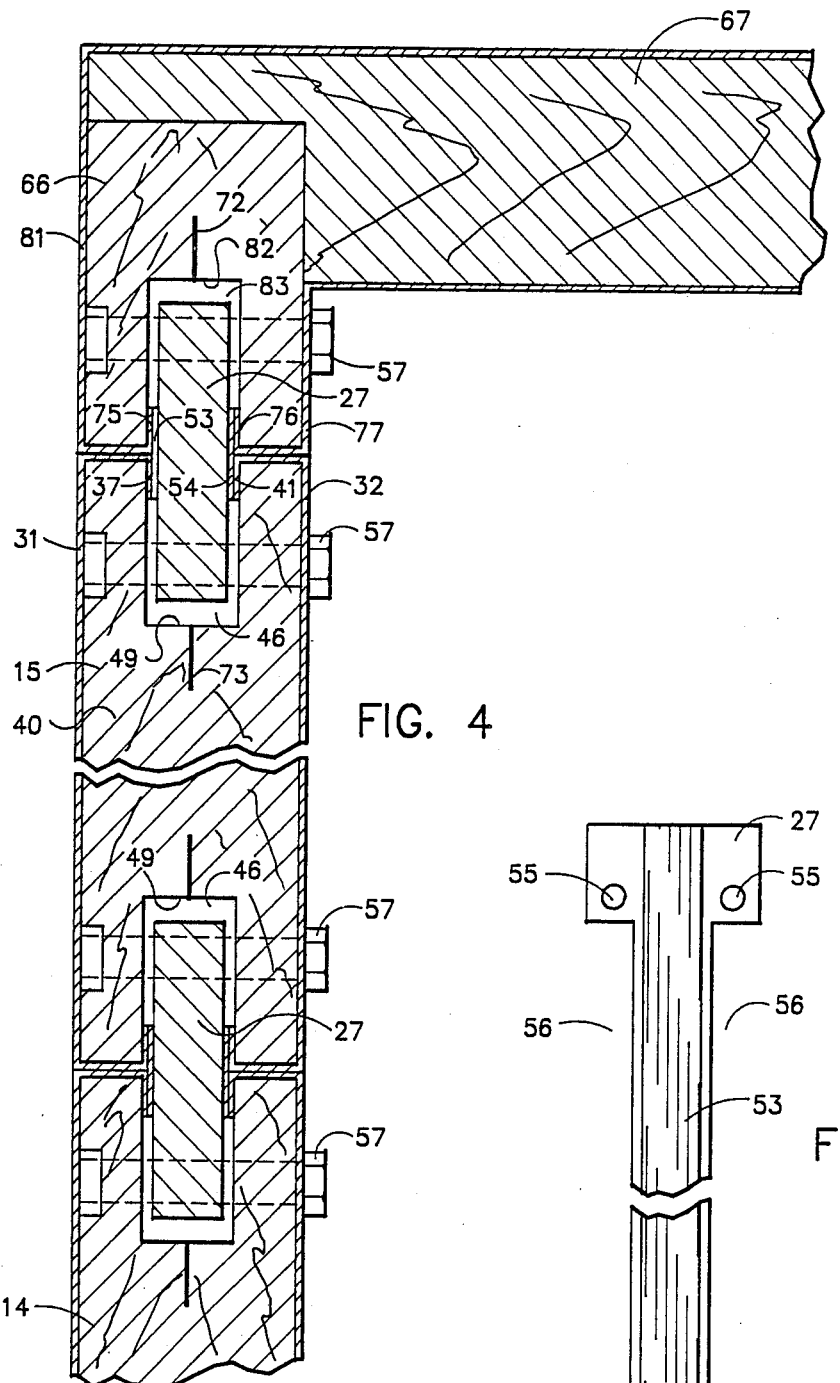
FIG. 4 is a fragmentary cross sectional view of three panels connected together in tongue and groove fashion.

The enlarged sectional view of FIG. 4 shows frame member 66 mounted at right angles with respect to the plane of panel 67. This panel may be a portion of one of the roof or floor panels or it may be side panel 16 with its right angle corner. Panel 16 is shown with a groove 46 at each end thereby facilitating interconnection by means of tongue strip 27 to side panel 67 and to the other side panel 14. Note that bolts 57 have positively secured the edge butting panels together by extending through the holes 55 as previously described in the flanges and in the tongue strip. This brings into physical and electrical contact shielding material strip 53 with facing shield surfaces 37 and 75 and shielding material strip 54 with facing shield surfaces 41 and 76.

It is easily seen from FIG. 4 that the interior shielding materials 32 and 77 are electrically continuous through conductive strip 54 on tongue strip 27 and outer shields 31 and 81 are electrically continuous through the contact with strip 53. Frame member 66 may be secured to panel 67 by appropriate means such as an adhesive so that it is a unitary element with panel 67.

FIG. 4 also shows an alternative embodiment of frame members 40, 66 wherein slots 72, 73 extend from blind ends 82, 49 of grooves 83, 46 part way to the opposite side of the frame member. This enables the frame member to have some flexibility to spread slightly if tongue strip 27 fits tightly in the groove and to flex inwardly when bolts 57 are tightened, both without any likelihood of causing the wood to split or break at the base of the slot. Alternatively, frame member 28 in FIG. 5 is shown with slot 84 all the way through from blind end 36 of groove 35. Thus frame member 28 is actually comprised of elements 85 and 86. Note that in view of the construction shown in detail in FIG. 4, there is no need to adhere elements 85 and 86 together. They are positively secured as part of the coupling of adjacent panels when bolted together as shown in FIGS. 3 and 4.

A major advantage of the structure of this invention is the simplicity by which the double isolated shielding enclosure is constructed. It is assembled and fully locked from the inside of the enclosure, using a minimum of panels, resulting in fewer seams and less possibilities of radio frequency leaks. No special locking for corners or connections between floor and side panels or top and side panels is required with the construction elements shown herein. The tongue strips are assembled to the panel frame members with bolts in such a manner as to separately engage both inside and outside shields so that they are electrically continuous from panel to panel, and at the same time the tongue strips keep the inner and outer shields electrically isolated from each other.

The tongue strips serve two primary purposes. One is, when combined with the two end bolts through holes 55, to hold two adjacent frame elements or panels together. Additionally, when the bolts are tightened, the inside surfaces of the groove forming flanges which are coated with the shield material are pressed tightly against the conductive tongue strips between them thereby providing positive continuation of the shields, both inside and outside, and at the same time maintaining the double electrical isolation.

In view of the above description, it is likely that modifications and improvements will occur to those skilled in the relevant art which are within the scope of the appended claims.

What is claimed is:

1. A modular double isolated electrically shielded enclosure comprising:
 a plurality of adjacent generally rectangular panels, each said panel having a peripheral frame constructed of frame members formed of electrically insulating material, each said panel being formed with an open groove extending peripherally therearound in externally facing surfaces of said frame members, each said groove being formed of juxtaposed spaced flanges having a plurality of spaced transverse holes therethrough and having a blind end, at least some of said frame members having said groove therein being formed with a slot extending from said blind end of said groove part way toward the opposite side of said frame member, thereby permitting flexibility of said flanges forming said groove and preventing possible splitting of said frame member;

electrically shielding material covering the sides of said panels, said shielding material terminating in shield surfaces spaced apart and electrically isolated from each other on opposite facing sides of said flanges in said grooves and extending only a portion of the way toward the inner blind end of said grooves;

a plurality of elongated tongue strips formed of electrically insulating material, said tongue strips being shaped and configured to reside at least partially within two adjacent said grooves and having a plurality of openings therethrough adjacent and along both edges thereof;

electrically conductive material arranged in elongated strips on each side of said tongue strips, one said strip of conductive material electrically connecting said shielding material on said flanges on one side of two adjacent frames, the other said strip of conductive material electrically connecting said shielding material on said flanges on the other side of the two adjacent frames, whereby said shielding on the same sides of said adjacent panels is electrically connected, and said shielding on one side of side adjacent panels is electrically isolated from said shielding on the opposite side of said panels; and a plurality of fastener members, each extending through both said flanges on each side of each said groove and through said openings on said tongue strips, said fastener members contacting said shielding material on no more than one side of said frames and securing adjacent said panels together.

2. A modular double isolated electrically shielded enclosure comprising:

a plurality of adjacent generally rectangular panels, each said panel having a peripheral frame constructed of frame members formed of electrically insulating material, each said panel being formed with an open groove extending peripherally therearound in externally facing surfaces of said frame members, each said groove being formed of juxtaposed spaced flanges having a plurality of spaced transverse holes therethrough and having a blind end, at least some of said frame members having said groove therein being formed with a slot extending completely through said frame member from said blind end of said groove, thereby making said frame member a combination of two elements in adjacent facing relationship;

electrically shielding material covering the sides of said panels, said shielding material terminating in shield surfaces spaced apart and electrically isolated from each other on opposite facing sides of said flanges in said grooves and extending only a portion of the way toward the inner blind end of said grooves;

a plurality of elongated tongue strips formed of electrically insulating material, said tongue strips being shaped and configured to reside at least partially within two adjacent said grooves and having a plurality of openings therethrough adjacent and along both edges thereof;

electrically conductive material arranged in elongated strips on each side of said tongue strips, one said strip of conductive material electrically connecting said shielding material on said flanges on one side of two adjacent frames, the other said strip of conductive material electrically connecting said shielding material on said flanges on the other side of the two adjacent frames, whereby said shielding on the same sides of said adjacent panels is electrically connected, and said shielding on one side of said adjacent panels is electrically isolated from said shielding on the opposite side of said panels; and a plurality of fastener members, each extending through both said flanges on each side of each said groove and through said openings on said tongue strips, said fastener members contacting said shielding material on no more than one side of said frames and securing adjacent said panels together.

* * * * *